United States Patent
Jacob et al.

(10) Patent No.: US 11,239,633 B2
(45) Date of Patent: Feb. 1, 2022

(54) PHOTONIC TRANSMITTER DRIVERS WITH LOGIC USING CASCADED DIFFERENTIAL TRANSISTOR PAIRS STEPPED BY SUPPLY VOLTAGE DIFFERENCES

(71) Applicants: GLOBALFOUNDRIES U.S. INC., Malta, NY (US); KHALIFA UNIVERSITY OF SCIENCE AND TECHNOLOGY, Abu Dhabi (AE)

(72) Inventors: Ajey Poovannummoottil Jacob, Watervliet, NY (US); Solomon M. Serunjogi, Kampala (UG); Mihai Adrian Tiberiu Sanduleanu, Abu Dhabi (AE)

(73) Assignees: GlobalFoundries U.S. Inc., Malta, NY (US); Khalifa University of Science and Technology, Abu Dhabi (AE)

(*) Notice: Subject to any disclaimer, the term of this patent is extended or adjusted under 35 U.S.C. 154(b) by 78 days.

(21) Appl. No.: 16/794,330

(22) Filed: Feb. 19, 2020

(65) Prior Publication Data
US 2021/0257811 A1   Aug. 19, 2021

(51) Int. Cl.
*H01S 5/042*   (2006.01)
*H03K 7/02*   (2006.01)
(Continued)

(52) U.S. Cl.
CPC ........ *H01S 5/0427* (2013.01); *G02F 1/0327* (2013.01); *H01S 5/0428* (2013.01);
(Continued)

(58) Field of Classification Search
CPC ....... H03K 19/018528; H03K 19/0002; H03K 19/017509; H03K 19/017536;
(Continued)

(56) References Cited

U.S. PATENT DOCUMENTS

| | | |
|---|---|---|
| 9,470,951 B2 | 10/2016 | Liboiron-Ladouceur et al. |
| 9,847,839 B2* | 12/2017 | Gopalakrishnan ...... H04L 25/00 |
| 9,942,063 B2 | 4/2018 | Mendel |
| 10,411,923 B2 | 9/2019 | Stojanovic et al. |

(Continued)

FOREIGN PATENT DOCUMENTS

KR   20090001356 A   *   1/2009

OTHER PUBLICATIONS

Farzan, Kamran, and David A. Johns. "A CMOS 10-GB/s power-efficient 4-PAM transmitter." IEEE Journal of Solid-State Circuits 39.3 (2004): 529-532. (Year: 2004).*

(Continued)

*Primary Examiner* — Ryan Johnson
(74) *Attorney, Agent, or Firm* — Gibb & Riley, LLC; David A. Cain, Esq.

(57) ABSTRACT

A driver circuit includes digital inputs, such as a first digital input and a second digital input. The digital inputs receive voltages at either a digital high-voltage or a digital low-voltage. The driver circuit has a clock input, an analog output, a first differential pair of transistors connected to the analog output, second differential pairs of transistors connected to the analog output, and voltage limiters connected to the clock input and the second differential pairs of transistors. The voltage limiters supply different voltages to the second differential pairs of transistors, which results in the second differential pairs of transistors providing analog signals to the analog output that are at different voltage steps at, and between, the digital high-voltage and the digital low-voltage.

20 Claims, 6 Drawing Sheets

(51) Int. Cl.
| | |
|---|---|
| *G02F 1/03* | (2006.01) |
| *H04L 25/49* | (2006.01) |
| *H03K 19/00* | (2006.01) |
| *H03K 19/0175* | (2006.01) |
| *H03K 19/0185* | (2006.01) |
| *H04L 25/03* | (2006.01) |

(52) U.S. Cl.
CPC ........... *H03K 7/02* (2013.01); *H03K 19/0002* (2013.01); *H03K 19/017509* (2013.01); *H03K 19/017536* (2013.01); *H03K 19/018528* (2013.01); *H04L 25/4917* (2013.01); *H04L 2025/03363* (2013.01)

(58) Field of Classification Search
CPC ... H03K 19/018514; H03K 19/018521; H03K 7/02; H04L 25/4917; H04L 2025/03363; H04L 25/0282; H03M 1/66; H03M 1/68; H03F 2203/45392; H03F 3/45089
See application file for complete search history.

(56) References Cited

U.S. PATENT DOCUMENTS 10,461,921 B2   10/2019  Bai et al.
2007/0052455 A1*  3/2007  Sung ..................... H03M 1/002
                                                327/108

OTHER PUBLICATIONS

Bassi et al., "A High-Swing 45 Gb/s Hybrid Voltage and Current-Mode PAM-4 Transmitter in 28 nm CMOS FDSOI", IEEE Journal of Solid-State Circuits, vol. 51, No. 11, 2016, pp. 2702-2715.

Cheng et al., "A 32/16-Gb/s Dual-Mode Pulsewidth Modulation Pre-Emphasis (PWM-PE) Transmitter With 30-dB Loss Compensation Using a High-Speed CML Design Methodology", IEEE Transactions on Circuits and Systems, vol. 56, No. 8, 2009, pp. 1794-1806.

Quadir et al., "An Inductorless Linear Optical Receiver for 20Gbaud/s (40Gb/s) PAM-4 Modulation using 28nm CMOS", IEEE, 2014, pp. 2473-2476.

* cited by examiner

PHOTONIC TRANSMITTER DRIVERS WITH LOGIC USING CASCADED DIFFERENTIAL TRANSISTOR PAIRS STEPPED BY SUPPLY VOLTAGE DIFFERENCES

BACKGROUND

Field of the Invention

The present disclosure relates to photonic transmitter drivers and more specifically to photonic transmitter drivers using cascaded differential transistor pairs.

Description of Related Art

In optical data transmission systems, the emitters or transmitters often use various types of drivers, one of which is a pulse amplitude modulation (PAM) driver. The modulation format or formats to be employed in the electrical interfaces include formats such as non-return to zero (NRZ), 4-ary, 8-ary, N-ary, etc., pulse amplitude modulation (PAM-4, PAM-8, PAM-N, etc.). PAM-4 is one example of multi-level amplitude modulation which is used in this disclosure for convenience of illustration and discussion; however those ordinarily skilled in the art would understand that all discussions using the PAM-4 examples herein are equally applicable to other modulation formats and, therefore, the claims at the end of this application are intended to be applicable to all such formats, whether currently known or developed in the future. In this example of PAM-4 drivers, two binary bits (duo binary) of information are processed simultaneously. The binary bits are represented here as $\overline{D1}$ and D1 for the first bit; and as $\overline{D2}$ and D2 for the second bit.

One issue surrounding 4-level pulse amplitude modulation driver circuits relates to the inability to conduct high frequency or larger bandwidth operation beyond 20 GHz. This limitation can be traced to the many sub-circuits involved in PAM-4 implementation. Specifically, PAM-4 implementations involve sub-circuits for Gray coding, PAM-4 logic generation, buffering, analog summation, etc. Each one of those building blocks adds capacitive loading when connected in cascade, which reduces overall bandwidth. Low supply voltages in sub-nanometric technology nodes limit the output swing of each sub-block, calling for more cascaded stages during buffering operation. The operating speed is then limited by the gain-bandwidth product of the cascaded system.

One solution to this issue is stacking the transistors to achieve a higher voltage level (such as 3V or higher) that is required to drive a commonly used photonics modulator, the Mach-Zehnder modulator (MZM). Stacking of transistors is directly proportional to silicon area and power consumption. Both complementary metal oxide semiconductor (CMOS) and current-mode logic (CML) devices require transistor stacking to realize various logic functions such as exclusive-OR (XOR), multiplexing (MUXes), ANDing etc. However, these circuits experience difficulty operating at supply voltage below 1V for any kind of PAM-4 or duo binary operation at high data rates.

SUMMARY

Various driver circuits herein include digital inputs connected to external multiplexors and buffers. The digital inputs can be a first digital input and a second digital input. The digital inputs receive voltages at either a digital high-voltage or a digital low-voltage. These driver circuits also have a clock input and a stepped analog output connected to an external laser-supplied transmission modulator.

A first differential pair of transistors and two or more second differential pairs of transistors are connected to the digital inputs and combine to produce an analog output. Additionally, voltage limiters are connected to the clock input and the second differential pairs of transistors. The voltage limiters supply different voltages to the second differential pairs of transistors, which results in the first and second differential pairs of transistors providing analog output at different voltage steps at, and between, the digital high-voltage and the digital low-voltage. Specifically, the threshold voltages of transistors that make up the voltage limiters determine the different voltage steps to be output.

Note that here the clock input is only connected to the voltage limiters and is not connected to the first differential pair of transistors. Also, transistors in the first and second differential pairs of transistors are connected to a common node and are supplied the same current. Additionally, transistors in the first and second differential pairs of transistors are the same size and same type of transistor; however, these transistors are a different size from the transistors of the voltage limiters.

Also, the foregoing components are arranged, and electrical connections connecting the first differential pair of transistors and the second differential pairs of transistors to the analog output are in a pattern, to form either a logical AND circuit, a logical OR circuit, a logical XOR circuit, etc., to perform Gray encoding, temperature encoding, adding, etc.

BRIEF DESCRIPTION OF THE DRAWINGS

The embodiments herein will be better understood from the following detailed description with reference to the drawings, which are not necessarily drawn to scale and in which.

DETAILED DESCRIPTION

As noted above, PAM driver circuits may be unable to conduct high frequency or larger bandwidth operation, and even stacking transistors has silicon area and power consumption repercussions. In view of these issues, this disclosure presents photonic transmitter drivers with logic using cascaded differential transistor pairs that are identical but are stepped by supply voltage differences. Again, while PAM-4 is used as an example in this discussion, all disclosed structures herein can be implemented in other modulation formats PAM-4, PAM-8, PAM-N, etc.).

In greater detail, these exemplary structures are presented as a single cell PAM-4 transmitter that preforms PAM-4 synthesis in one block (i.e. thermometer (unary) encoding), and PAM-4 logic generation and summation in parallel. The drivers herein do not need extra stages for buffering and amplification. Therefore, this disclosure presents a new CML logic family that replaces the binary outputs of a classical digital logic gate with analog outputs (similar to digital-to-analog converter (DAC) circuitry). The drivers here provide memory-based logic gates, and in non-limiting examples, a memory based AND gate, OR gate, and XOR gate. The drivers herein utilize a combination of CML clocked and unclocked buffers sharing the same output at the drain. Thus, these structures use clocking of the circuit at the same level as the input transistors.

As shown in the accompanying drawings and as discussed in detail below, the PAM-4 driver circuits presented as examples in this disclosure use clocked and unclocked buffer layers, where both the input signals and the clock inputs are at the same voltage levels. These PAM-4 driver circuits use a single unclocked buffer and another pair of clocked buffers with the clock signal replacing one of the inputs in order to provide analog-type output at different voltage steps. In the examples presented, the circuit configuration creates memory based AND, XOR, and OR circuits; however, those ordinarily skilled in the art would understand that other logic circuits can be derived consequently from the same and such are intended to also be disclosed herein using the AND, XOR, and OR circuits as examples of all such logic circuits.

Figure 1:
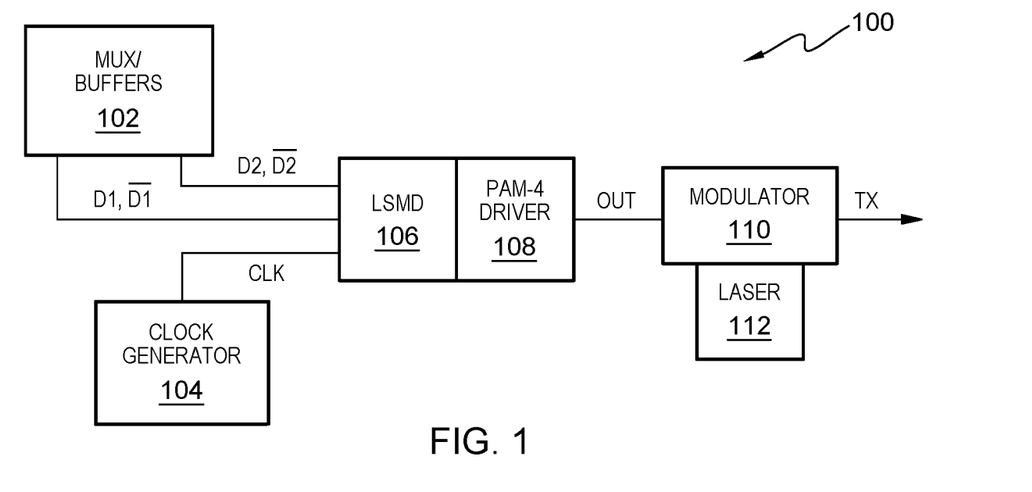
FIG. 1 is a schematic diagram illustrating an optical transmitter according to embodiments herein.

FIG. 1 illustrates one exemplary transmitter device 100 that includes various multiplexers and buffers 102 outputting data signals to various digital inputs D1, $\overline{D1}$, D2, $\overline{D2}$. Additionally, a clock generator 104 provides a clock signal to various clock inputs (CLK). These signals are supplied to, for example, a large swing modulation driver (LSMD) 106 which feeds a PAM-4 driver 108. Various versions of the PAM-4 driver 108 are shown in FIGS. 2A-3C, all discussed below. The PAM-4 Driver 108 outputs analog signal to a modulator 110 which utilizes the laser 112 to provide optical transmission output (TX).

Figure 2A:
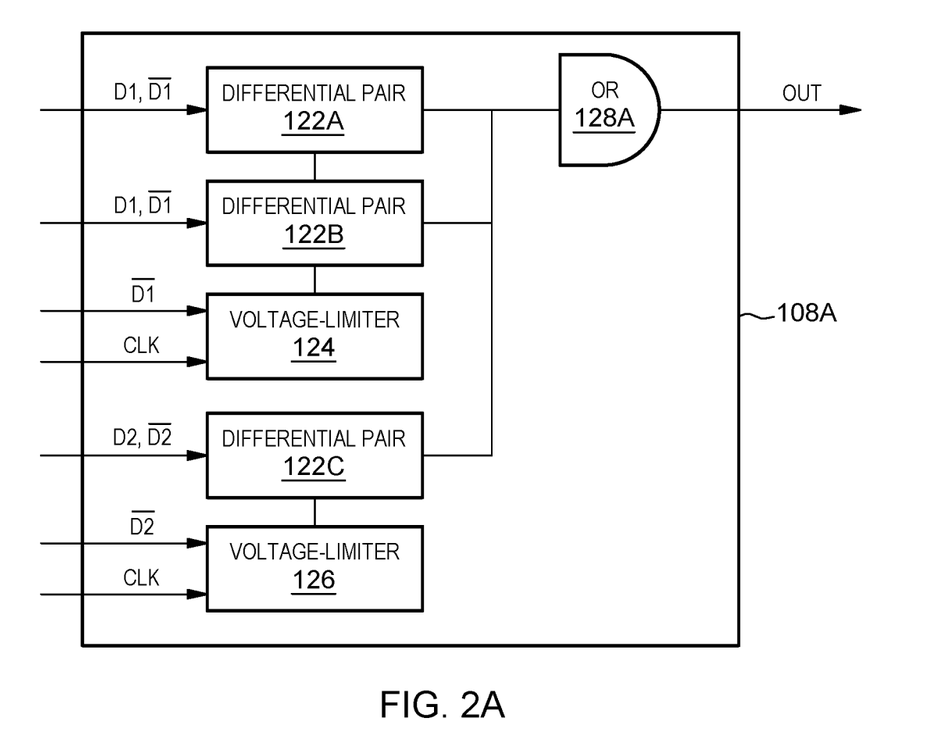
FIGS. 2A-2D are schematic diagrams illustrating different examples of the generic driver shown in FIG. 1 as logical OR, XOR, AND and any other logic suitable function, respectively.

As shown for example in FIG. 2A, driver circuits 108 herein include digital inputs D1, $\overline{D1}$, D2, $\overline{D2}$ connected to the external multiplexors and buffers 102. The digital inputs D1, $\overline{D1}$, D2, $\overline{D2}$ can be first complementary digital inputs D1, $\overline{D1}$, and second complementary digital inputs D2, $\overline{D2}$. The digital inputs D1, $\overline{D1}$, D2, $\overline{D2}$ receive voltages at either a digital high-voltage or a digital low-voltage, which represent data as a zero or a one. These driver circuits 108 also have a clock input (CLK) and an analog output (Out) connected to the external laser-supplied transmission modulator 110.

FIG. 2A shows a first (unclocked) differential pair of transistors 122A connected to the first digital inputs D1, $\overline{D1}$ and the analog output (Out). Two or more second differential pairs of transistors 122B, 122C are connected to the analog output (Out). Gates of the second differential pairs of transistors 122B, 122C are connected to at least the second digital inputs D2, $\overline{D2}$ (and sometimes also to one or more of the first digital inputs D1, $\overline{D1}$).

Additionally, FIG. 2A shows voltage limiters 124, 126 that include differently sized transistors connected to the first digital inputs D1, $\overline{D1}$ (and sometimes also to one or more of the second digital inputs D2, $\overline{D2}$), the clock input (CLK), and the second differential pairs of transistors 122B, 122C. The voltage limiters 124, 126 supply different voltages to the second differential pairs of transistors 122B, 122C, which results in the second differential pairs of transistors 122B, 122C providing analog signals to the analog output (Out) that are at different voltage steps at, and between, the digital high-voltage and the digital low-voltage. Thus, the combination of the first differential pair of transistors 122A and the second differential pairs of transistors 122B, 122C output three different sets of high and low voltages (six voltage steps in total), which are provide on the common output nodes OUT, $\overline{OUT}$ that are shared by the sources/drains of all six differential pair transistors 122A, 122B, and 122C. Specifically, the threshold voltages of transistors that make up the voltage limiters 124, 126 determine the different voltage steps to be output by the differential pairs of transistors. Therefore, the second differential pairs of transistors 122B, 122C are (clocked) cascaded differential transistor pairs that are identical but are stepped by supply voltage differences provided by the voltage limiters 124, 126.

Note that here the clock input (CLK) is only connected to the voltage limiters 124, 126 and is not connected to the first differential pair of transistors 122A. Also, transistors in the first differential pair of transistors 122A and the second differential pairs of transistors 122B, 122C are supplied the same current. Additionally, transistors in the first differential pair of transistors 122A and the second differential pairs of transistors 122B, 122C are the same size and same type of transistor; however, the transistors in the first differential pair of transistors 122A and the second differential pairs of transistors 122B, 122C are a different size from the transistors of the voltage limiters 124, 126.

Figure 2B:
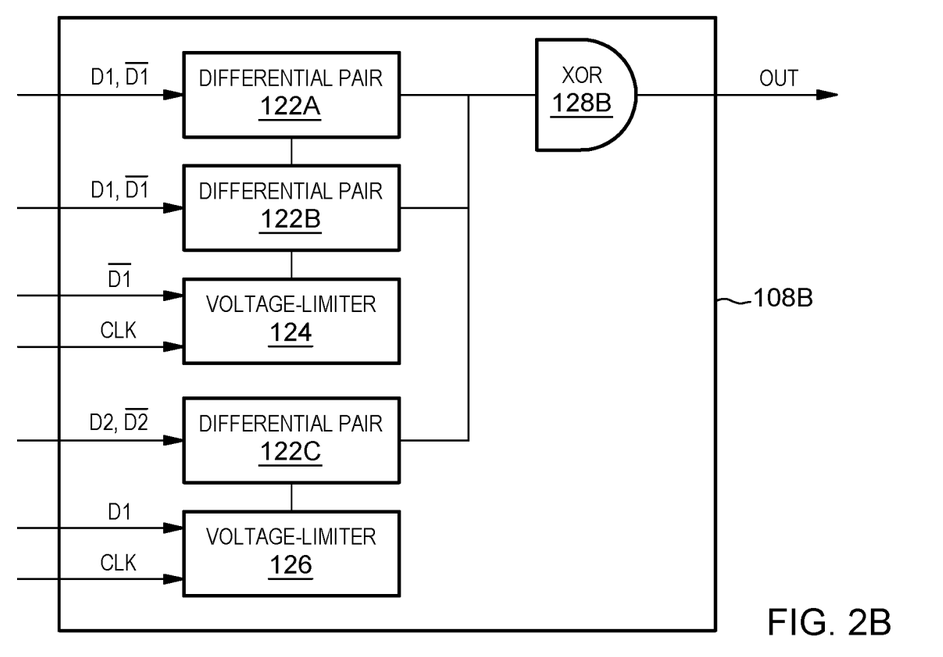
Figure 2C:
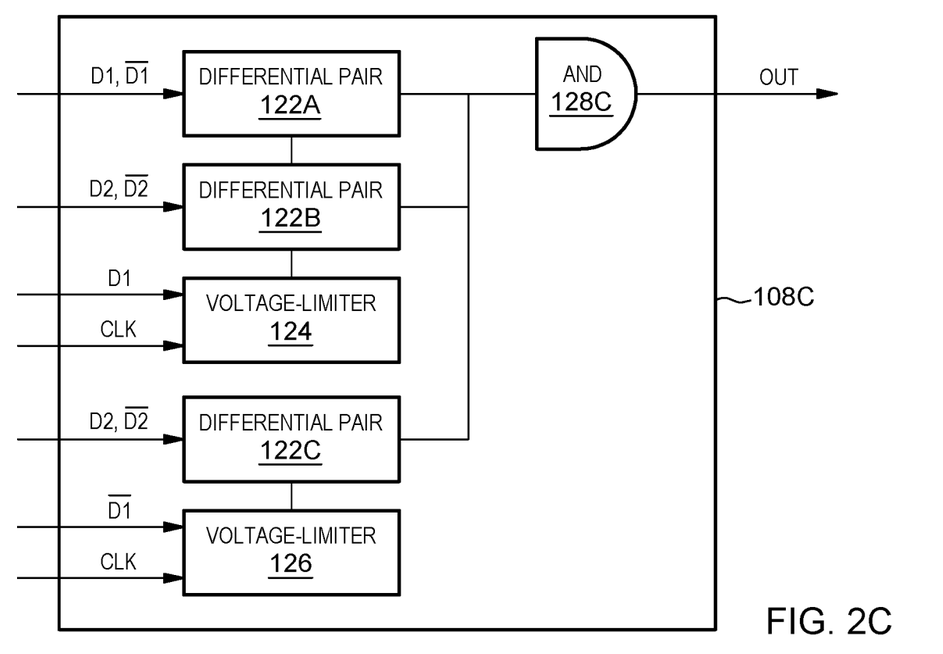
Figure 2D:
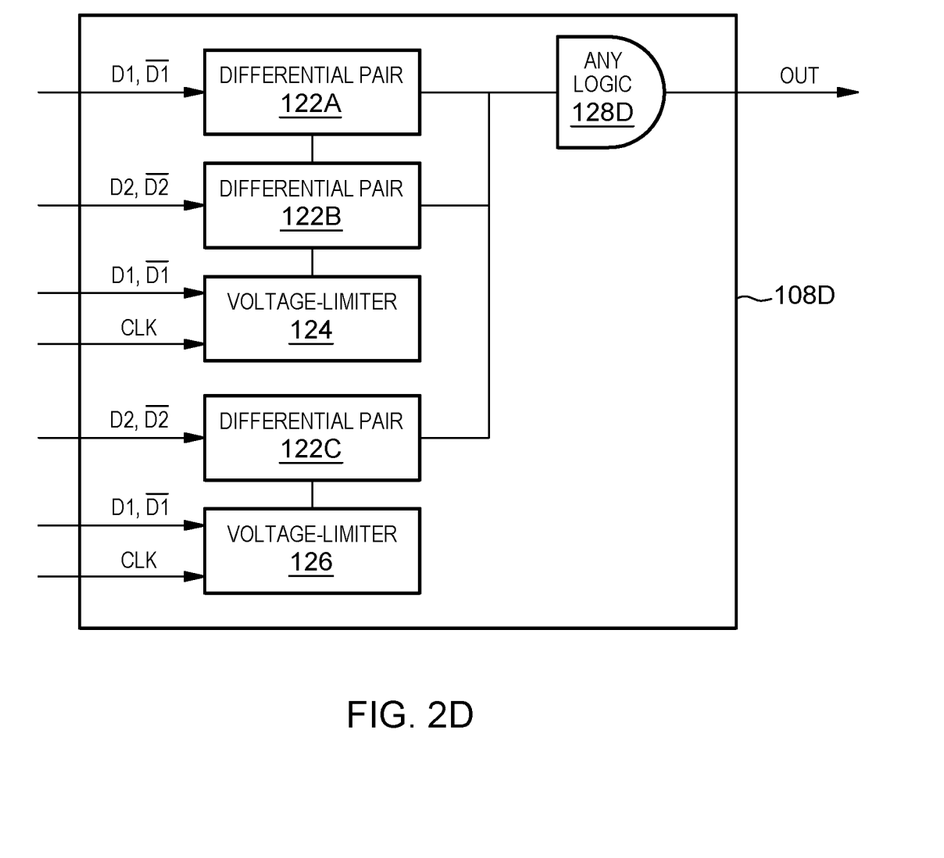

As shown in FIGS. 2A-2C, the foregoing components are arranged, and electrical connections connecting the first differential pair of transistors 122A and the second differential pairs of transistors 122B, 122C to the analog output (Out) are in a pattern, to form either, a logical OR circuit 128A (FIG. 2A), a logical XOR circuit 128B (FIG. 2B), a logical AND circuit 128C (FIG. 2C), or any other logic function circuit 128D (FIG. 2D) so as to perform different functions including Gray encoding, temperature encoding, adding, etc.

Figure 3A:
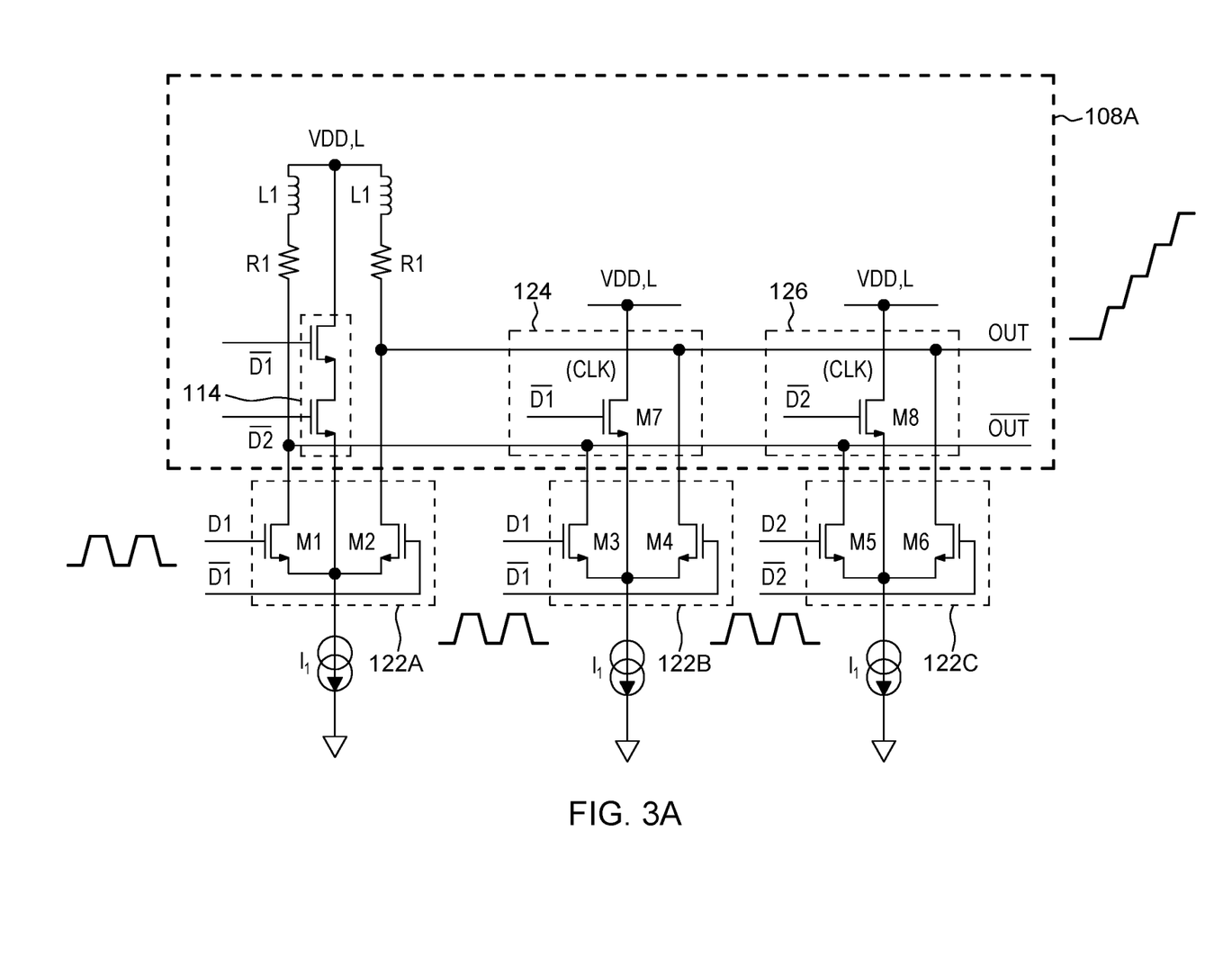
FIGS. 3A-3C are schematic diagrams illustrating specific examples of logical OR, XOR and AND circuits shown respectively in FIGS. 2A-2C.
Figure 3B:
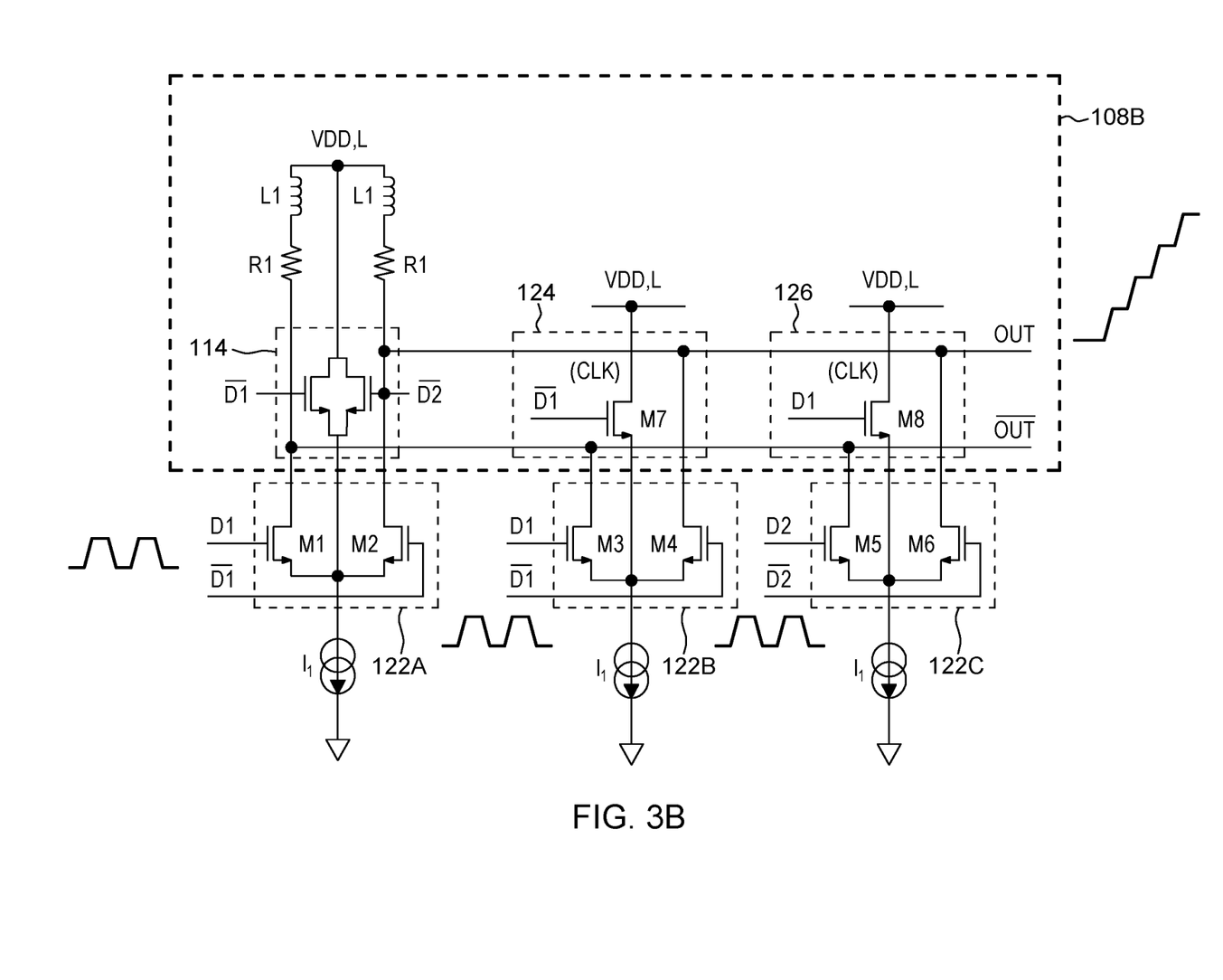
Figure 3C:
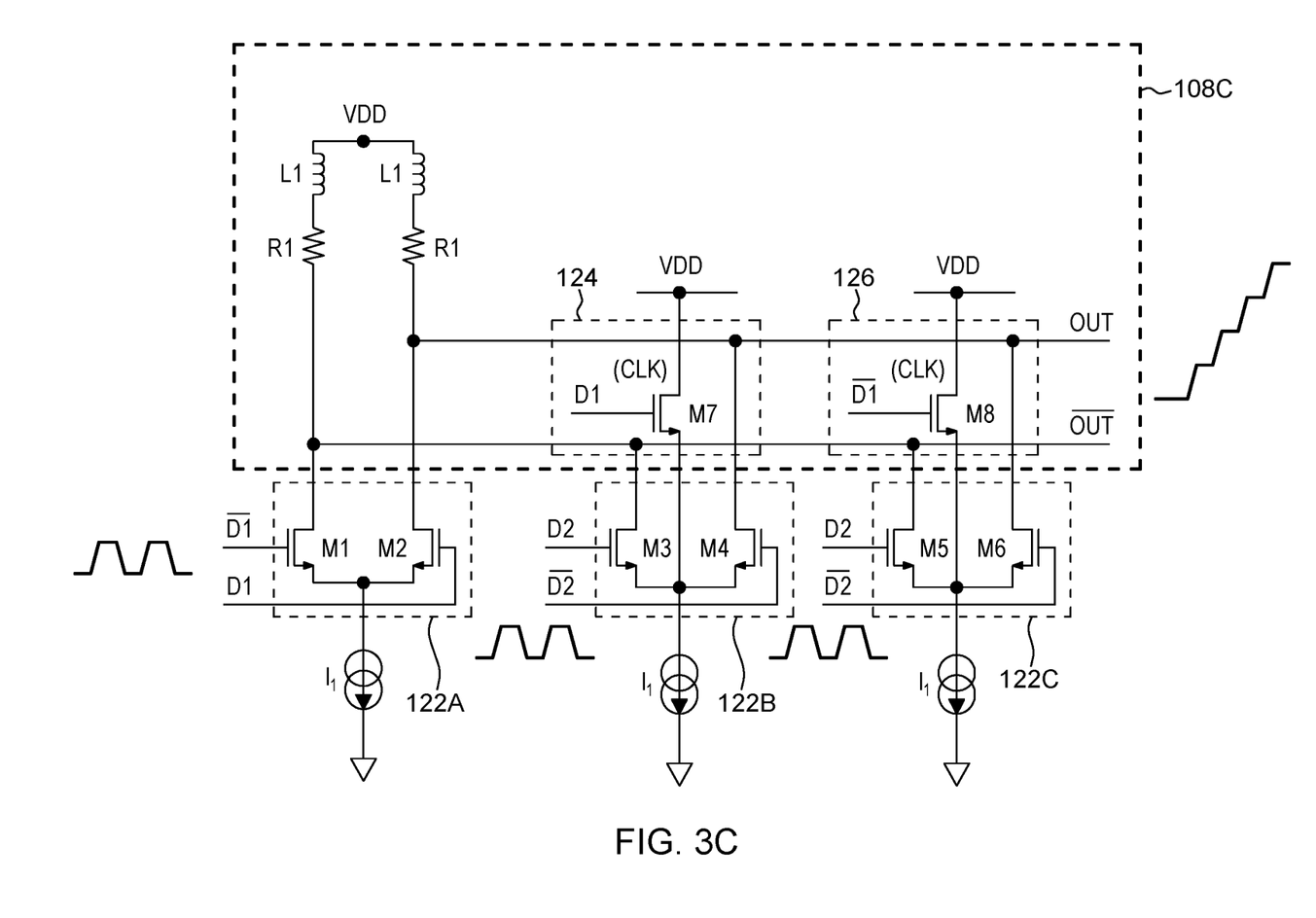

To provide specifics example of implementations of the PAM-4 Driver 108, the logical OR, XOR, and AND drivers shown in FIGS. 2A-2C are presented in circuit view in FIGS. 3A-3C; however, those skilled in the art would understand that the conceptual diagrams 2A-2C could be implemented in many different circuits other than the examples shown in FIGS. 3A-3C.

Here the PAM-4 AND driver 108A-108C includes digital inputs D1, $\overline{D1}$, D2, $\overline{D2}$ connected to the external multiplexors and buffers 102 (FIG. 1). The digital inputs D1, $\overline{D1}$, D2, $\overline{D2}$ include the first digital inputs D1, $\overline{D1}$ and the second digital inputs D2, $\overline{D2}$. The digital inputs D1, $\overline{D1}$, D2, $\overline{D2}$ receive voltages at either a digital high-voltage or a digital low-voltage (1 or 0). As shown in FIGS. 3A-3C, the first digital inputs D1, $\overline{D1}$ receives first true data D1 and first complement data $\overline{D1}$. The second digital inputs D2, $\overline{D2}$ receives second true data D2 and second complement data $\overline{D2}$. FIGS. 3A-3C also show the clock input (CLK) and an analog output (Out) connected to the external laser-supplied transmission modulator 110 (FIG. 1).

As shown in FIG. 3A-3C, the first differential pair of transistors 122A (M1, M2) are connected to the first digital inputs D1, $\overline{D1}$ and the analog output (Out, $\overline{Out}$). Also, diversion circuit 114 controls when the first differential pair of transistors 122A (M1, M2) are connected to the nominal supply voltage VDD. The diversion circuit 114 either diverts all the current through the transistors internal to the diversion circuit 114, or causes all the current to flow through the first differential pair of transistors 122A (M1, M2) thereby eliminating any memory effect in the first differential pair of transistors 122A (M1, M2). More specifically, diversion circuit 114 includes clamping transistors that impose an additional condition that both digital inputs ($\overline{D1}$, $\overline{D2}$) must be in the same state (both zero or both one) for current diversion to occur.

Both the OR and XOR implementations 108A, 108B shown in FIGS. 3A-3B use the diversion circuit 114 to controllably connect the first differential pair of transistors 122A (M1, M2) to VDD; however, in the AND implementation 108C shown in FIG. 3C, no diversion circuit 114 is used, causing the first differential pair of transistors 122A (M1, M2) to be constantly connected to VDD in the AND implementation 108C. Also, in the OR and XOR implementations 108A, 108B shown in FIGS. 3A-3B, the gate of transistor M1 is connected to D1 and the gate of transistor M2 is connected to $\overline{D1}$; however, in the AND implementation 108C shown in FIG. 3C, the gate of transistor M1 is connected to $\overline{D1}$ and the gate of transistor M2 is connected to D1.

In the OR and XOR implementations 108A, 108B shown in FIGS. 3A-3B, one of the second differential pair of transistors 122B (M3, M4) is connected to the first digital inputs D1, $\overline{D1}$ and the analog output (Out, $\overline{Out}$); while the other second differential pair of transistors 122C (M5, M6) is connected to the second digital inputs D2, $\overline{D2}$ and the analog output (Out, $\overline{Out}$). In contrast, because of the different logical function in the AND implementation 108C shown in FIG. 3C, both of the second differential pairs of transistors 122B (M3, M4), 122C (M5, M6) are connected to the second digital inputs D2, $\overline{D2}$ and the analog output (Out, $\overline{Out}$).

More specifically, FIGS. 3A-3B show that in the OR and XOR implementations 108A, 108B the gates of transistors M3 and M4 are connected to D1, $\overline{D1}$, respectively and the gates of transistors M5 and M6 are connected to D2, $\overline{D2}$, respectively. Contrast the different logic AND implementation 108C shown in FIG. 3C, where the gates of transistors M3 and M4 are connected to D2, $\overline{D2}$, respectively and the gates of transistors M5 and M6 are similarly connected to D2, $\overline{D2}$, respectively FIGS. 3A-3C additionally show that the voltage limiters 124, 126 are made up of transistors, M7, M8, which are connected to the either of the digital inputs D1, $\overline{D1}$, D2, $\overline{D2}$, the clock input (CLK), and the second differential pairs of transistors 122B, 122C. The drains of transistors M7 and M8 connected directly to the nominal supply voltage VDD. The voltage limiters 124, 126 supply different voltages to the second differential pairs of transistors 122B, 122C. Thus, the source of M7 is connected to sources of M3, M4 and the source of M8 is connected to sources of M5, M6 so as to supply such different voltages.

In greater detail, the OR implementation 108A shown in FIG. 3A, $\overline{D1}$ is connected to the gate of M7, and $\overline{D2}$ is connected to the gate of M8. In the XOR implementation 108B shown in FIG. 3B, $\overline{D1}$ is connected to the gate of M7, and D1 is connected to the gate of M8. Also, in the AND implementation 108C shown in FIG. 3C, D1 is connected to the gate of M7, and $\overline{D1}$ is connected to the gate of M8.

Therefore, as shown in FIGS. 3A-3C, the clock CLK supplied to the gates of the voltage limiters M7, M8 controls when voltage (VDD) is supplied to the second differential pairs of transistors 122B (M3, M4), 122C (M5, M6), and the different sizes of the voltage limiters M7, M8 results in different voltages being supplied to the second differential pairs of transistors 122B (M3, M4), 122C (M5, M6). Therefore, this clocks the second differential pairs of transistors 122B (M3, M4), 122C (M5, M6) and supplies different voltages to the second differential pairs of transistors 122B (M3, M4), 122C (M5, M6) so as to provide an analog-like stepped output.

The sizing of the inputs M7 and M8 is different from the input transistor pairs M1, M2 and M3, M4. The clamped transistor M7 could be sized identically or differently from M8. The PAM-4 analog threshold levels at the output are set by the strength of M7 and M8. Threshold and voltage levels can be chosen independently of each other by adjusting the W/L ratio of M7, M8. Also, the VDD of M7 and M8 are not cascaded with M1 and M2 or M3, M4 and M5, M6. Further, the load resistance R1 and the tuning inductance L1 are shared between the drains of differential pair M1, M2, M3, M4 and M5, M6. The inputs D1 and D2 have the same (balanced) fan out or parasitic loading; hence minimizing the variations in rise and fall times at the output.

FIGS. 3A-3C further show that the same resistance and inductance (L1, R1) is supplied to all drains/sources of all transistors to ensure balanced capacitive loading. Also, FIGS. 3A-3C show that the first differential pair of transistors 122A (M1, M2) can be constantly or controllably (using diversion circuit 114) supplied VDD, while the second differential pairs of transistors 122B (M3, M4), 122C (M5, M6) are differently supplied voltages other than VDD through the voltage limiters M7, M8, which allows the drivers to output three different sets of high and low voltages (six voltage steps in total), which are provided on the common output nodes OUT, $\overline{OUT}$ that are shared by the sources/drains of all six differential pair transistors. This provides a digital-to-analog conversion of the digital square waves (shown in FIGS. 3A-3C adjacent each differential pair) to the analog waveform (shown in FIGS. 3A-3C adjacent the outputs).

Again, this results in the second differential pairs of transistors 122B, 122C providing analog signals to the analog output (Out) that are at different voltage steps at, and between, the digital high-voltage and the digital low-voltage. Specifically, the threshold voltages of transistors that make up the voltage limiters 124, 126 determine the different voltage steps to be output by the second differential pairs.

Note that here the clock input (CLK) is only connected to the voltage limiters 124, 126 (which clocks the second differential pairs of transistors 122B, 122C) and is not connected to the first differential pair of transistors 122A (which remain unclocked). Also, transistors in the first differential pair of transistors 122A and the second differential pairs of transistors 122B, 122C are connected to a common node and are supplied the same current. Further, transistors in the first differential pair of transistors 122A and the second differential pairs of transistors 122B, 122C are the same size and same type of transistor; however, the transistors in the first differential pair of transistors 122A and the second differential pairs of transistors 122B, 122C are a different size from the transistors of the voltage limiters 124, 126 to help output different voltage steps.

Also, these non-limiting examples show that the foregoing components can be arranged, and electrical node connections connecting the sources/drains of the first differential pair of transistors 122A and the second differential pairs of transistors 122B, 122C to the analog output (OUT, $\overline{OUT}$) are in a pattern, to form logical OR, XOR, and AND circuits; however, as noted above component rearrangement and electrical connection changes which would be well-known to one skilled in the art could convert the circuit shown in FIGS. 3A-3C into any other logic circuit, and the drawings accompanying this description are intended to thereby illustrate all such structures as well as any other logical structures useful in performing processing such as Gray encoding, temperature encoding, adding, etc.

Further, the clocked transistors (M7 and M8) introduce a memory effect. Specifically, the PAM-4 driver circuits presented here include the differential pair M1 and M2 at the input stage and another two differential pairs M3, M4 and M5, M6, with extra transistors (voltage limiters) M7 and M8 connected at the sources of differential pairs M3, M4 and M5, M6. Here, M3 and M4 act as a first memory pair and M5 and M6 act as second memory pair. The memory analog levels are set by adjusting the sizes of clamped transistors M7 and M8. Again, the size of M7 and M8 could be identical but different from the sizing of the input transistors.

Thus, this exemplary PAM-4 driver circuit uses two inputs D1 and D2. D1 is the input to the unclocked memoryless differential pair M1, M2, while a combination of D1 and D2 is the input to the second and third differential pairs, M3, M4 and M5, M6. The sources of M3, M4 and M5, M6 are clamped with additional transistors M7 and M8. Differential data at the gates of M3, M4 and M5, M6 is identical to ensure balanced capacitive loading. Also, inputs M7 and M8 share the same load so that input data is identical.

Each respective figure, in addition to illustrating methods of and functionality of the present embodiments at various stages, also illustrates the logic of the method as implemented, in whole or in part, by one or more devices and structures. Such devices and structures are configured to (i.e., include one or more components, such as resistors, capacitors, transistors and the like that are connected to enable the performing of a process) implement the method described above. In other words, one or more computer hardware devices can be created that are configured to implement the method and processes described herein with reference to the figures and their corresponding descriptions.

Embodiments herein may be used in a variety of electronic applications. A resulting device and structure, such as an integrated circuit (IC) chip can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

While the foregoing has been described in detail in connection with only a limited number of embodiments, it should be readily understood that the embodiments herein are not limited to such disclosure. Rather, the elements herein can be modified to incorporate any number of variations, alterations, substitutions or equivalent arrangements not heretofore described, but which are commensurate with the spirit and scope herein. Additionally, while various embodiments have been described, it is to be understood that aspects herein may be included by only some of the described embodiments. Accordingly, the claims below are not to be seen as limited by the foregoing description. A reference to an element in the singular is not intended to mean "one and only one" unless specifically stated, but rather "one or more." All structural and functional equivalents to the elements of the various embodiments described throughout this disclosure that are known or later, come to be known, to those of ordinary skill in the art are expressly incorporated herein by reference and intended to be encompassed by this disclosure. It is therefore to be understood that changes may be made in the particular embodiments disclosed which are within the scope of the foregoing as outlined by the appended claims.

What is claimed is:

1. A driver circuit comprising:
    digital inputs comprising a first digital input and a second digital input;
    a clock input;
    an analog output;
    a first differential pair of transistors connected to the first digital input and the analog output;
    second differential pairs of transistors connected to the second digital input and the analog output; and
    voltage limiters connected to the clock input and the second differential pairs of transistors, and
    wherein the second differential pairs of transistors provide analog signals to the analog output.

2. The driver circuit according to claim 1, wherein threshold voltages of the voltage limiters determine the voltage to be output by the second differential pairs of transistors.

3. The driver circuit according to claim 1, wherein the clock input is directly connected only to the voltage limiters and is not directly connected to the first differential pair of transistors.

4. The driver circuit according to claim 1, further comprising electrical connections connecting the first differential pair of transistors and the second differential pairs of transistors to the analog output, wherein the electrical connections are in a pattern to form either a logical XOR circuit, a logical OR circuit, or a logical AND circuit.

5. The driver circuit according to claim 1, wherein transistors in the first differential pair of transistors and the second differential pairs of transistors are connected to a common node and are supplied a same current.

6. The driver circuit according to claim 1, wherein transistors in the first differential pair of transistors and the second differential pairs of transistors are a same size and same type of transistor.

7. The driver circuit according to claim 1, wherein transistors in the first differential pair of transistors and the second differential pairs of transistors are a different size from transistors of the voltage limiters.

8. A driver circuit comprising:
    digital inputs connected to external multiplexors and buffers, wherein the digital inputs comprise a first digital input and a second digital input;
    a clock input;
    an analog output connected to an external laser-supplied transmission modulator;
    a first differential pair of transistors connected to the analog output, wherein gates of the first differential pair of transistors are connected to the first digital input;
    second differential pairs of transistors connected to the analog output, wherein gates of the second differential pairs of transistors are connected to at least the second digital input; and
    voltage limiters comprising transistors connected to the clock input and the second differential pairs of transistors, and
    wherein the second differential pairs of transistors provide analog signals to the analog output.

9. The driver circuit according to claim 8, wherein threshold voltages of the voltage limiters determine the different voltage steps to be output by the second differential pairs of transistors.

10. The driver circuit according to claim 8, wherein the clock input is directly connected only to the voltage limiters and is not directly connected to the first differential pair of transistors.

11. The driver circuit according to claim 8, further comprising electrical connections connecting the first differential pair of transistors and the second differential pairs of transistors to the analog output, wherein the electrical connections are in a pattern to form either a logical XOR circuit, a logical OR circuit, or a logical AND circuit.

12. The driver circuit according to claim 8, wherein transistors in the first differential pair of transistors and the second differential pairs of transistors are connected to a common node and are supplied a same current.

13. The driver circuit according to claim 8, wherein transistors in the first differential pair of transistors and the second differential pairs of transistors are a same size and same type of transistor.

14. The driver circuit according to claim 8, wherein transistors in the first differential pair of transistors and the second differential pairs of transistors are a different size from transistors of the voltage limiters.

15. A driver circuit comprising:
digital inputs connected to external multiplexors and buffers, wherein the digital inputs comprise a first digital input and a second digital input, wherein the first digital input receives first true data D1 and first complement data $\overline{D1}$, wherein the second digital input receives second true data D2 and second complement data $\overline{D2}$;
a clock input;
an analog output connected to an external laser-supplied transmission modulator;
a first differential pair of transistors M1, M2, connected to the first digital input and the analog output,
second differential pairs of transistors M3, M4, and M5, M6 connected to the second digital input and the analog output; and
voltage limiters comprising transistors, M7, M8 connected to the first digital input, the clock input, and the second differential pairs of transistors,
wherein a source of M7 is connected to sources of M3, M4 and a source of M8 is connected to sources of M5, M6, and
wherein the second differential pairs of transistors provide analog signals to the analog output.

16. The driver circuit according to claim 15, wherein threshold voltages of the voltage limiters determine the different voltage steps to be output by the second differential pairs of transistors.

17. The driver circuit according to claim 15, wherein the clock input is directly connected only to the voltage limiters and is not directly connected to the first differential pair of transistors.

18. The driver circuit according to claim 15, further comprising electrical connections connecting the first differential pair of transistors and the second differential pairs of transistors to the analog output, wherein the electrical connections are in a pattern to form either a logical XOR circuit, a logical OR circuit, or a logical AND circuit.

19. The driver circuit according to claim 15, wherein transistors in the first differential pair of transistors and the second differential pairs of transistors are connected to a common node and are supplied a same current.

20. The driver circuit according to claim 15, wherein transistors in the first differential pair of transistors and the second differential pairs of transistors are a same size and same type of transistor.

* * * * *